SILICON CELL CONSTRUCTION AND METHOD OF MANUFACTURE THEREFOR

Filed Aug. 10, 1965 3 Sheets-Sheet 1

INVENTOR.
JOHN M. GAULT

BY

Ostrolenk, Faber, Gerb & Soffen

ATTORNEYS

SILICON CELL CONSTRUCTION AND METHOD OF MANUFACTURE THEREFOR

Filed Aug. 10, 1965

INVENTOR.
JOHN M. GAULT
BY
OSTROLENK, FABER, GERB & SOFFEN
ATTORNEYS

SILICON CELL CONSTRUCTION AND METHOD OF MANUFACTURE THEREFOR

Filed Aug. 10, 1965

INVENTOR.
JOHN M. GAULT
BY
OSTROLENK, FABER, GERB & SOFFEN
ATTORNEYS

United States Patent Office 3,483,039

Patented Dec. 9, 1969

3,483,039

SILICON CELL CONSTRUCTION AND METHOD OF MANUFACTURE THEREFOR

John M. Gault, Manhattan Beach, Calif., assignor to International Rectifier Corporation, El Segundo, Calif., a corporation of California Filed Aug. 10, 1965, Ser. No. 478,663
Int. Cl. H01l 15/02, 5/00
U.S. Cl. 136—89 9 Claims

ABSTRACT OF THE DISCLOSURE

A solar cell formed of a thin wafer of silicon in which spaced parallel strips of P-type material are disposed immediately below the surface of an N-type wafer. The strips reach the wafer surface at the rear of the wafer to receive an upper electrode and a lower electrode is connected to the bottom of the wafer. The P-type strips define totally enclosed and embedded junctions within the wafer to improve radiation resistance and to permit a decrease in internal cell resistance and an increase in both open circuit voltage and short circuit current for the cell.

This invention relates to photovoltaic cells commonly known as solar cells, and more specifically relates to a novel junction configuration and method of manufacture of a solar cell which provides an enclosed junction within the cell structure, and provides substantial improvement in the various parameters of the solar cell device.

Solar cells are devices well known to the art, and are commonly formed of a wafer of monocrystalline silicon which has a junction therein in close proximity to the upper surface of the wafer. In designing a solar cell, many compromises must be made in the design parameters to achieve desired radiation resistance, internal cell resistance, open circuit voltage and short circuit current. In many cases, the requirements to improve one of these parameters acts to the disadvantage of another parameter, whereby design compromises are necessary.

The principle of the present invention is to provide a novel solar cell which has an elongated self-enclosed junction adjacent the surface of the cell which frees the designer of the contradictory requirements for the above noted parameters, whereby an improved cell can be designed which is superior to prior art devices in at least radiation resistance, internal cell resistance, open circuit voltage and short circuit current.

Accordingly, a primary object of this invention is to provide a novel solar cell which has a closed junction contained beneath the surface of the cell.

Another object of this invention is to provide a novel solar cell wherein a volume of one of the conductivity type materials is embedded in a wafer of the other of the conductivity types.

Another object of this invention is to provide a novel method of manufacture for solar cells.

Still another object of this invention is to improve the radiation resistance of the solar cell.

Another object of this invention is to provide a novel solar cell with relatively small cell resistance.

A further object of this invention is to provide a novel solar cell having an increased open circuit voltage.

Yet another object of this invention is to increase the short circuit current of a solar cell.

These and other objects of this invention will become apparent from the following description when taken in connection with the drawings, in which.

Figure 5:
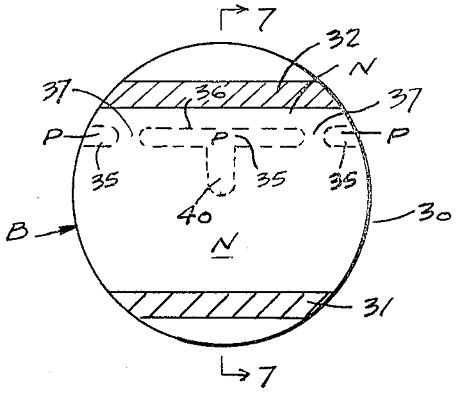
Figure 6:
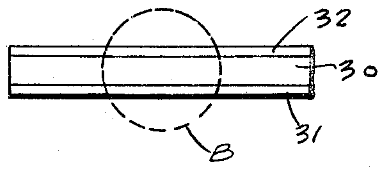

FIGURE 5 corresponds to the circled portion in FIGURE 6 labeled B, and is a blown-up view of that section.

Figure 4:
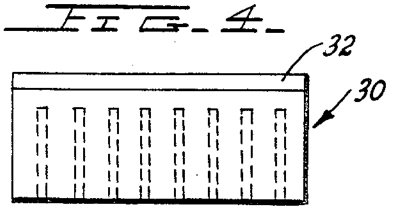
FIGURE 4 is a top view of the solar cell of the invention.

FIGURE 6 is a front view of FIGURE 4.

Figure 7:
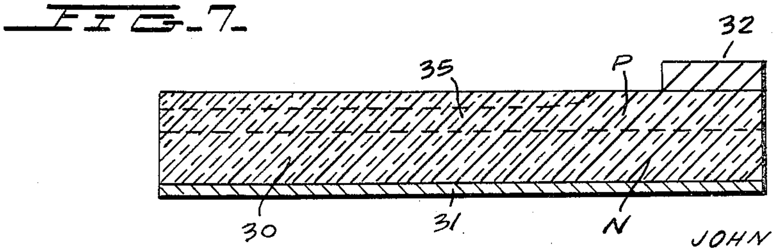

FIGURE 7 is a cross-sectional view of FIGURE 5 taken across the line 7—7 in FIGURE 5.

FIGURES 8 through 14 illustrate the steps used in the manufacture of the device of FIGURES 4 through 7.

Figure 15:
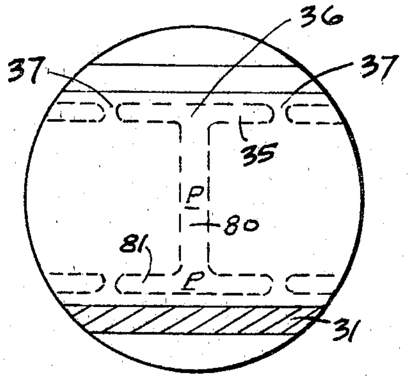

FIGURE 15 is an enlarged view of a section of a modified device made in accordance with the invention and corresponds to a view similar to that of FIGURE 5.

Figure 1:
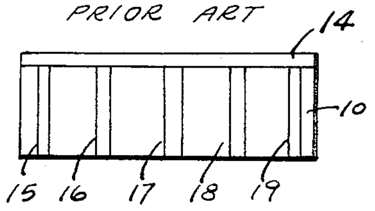
FIGURE 1 is a top view of a typical prior art silicon solar cell having collector grids on the upper surface thereof.
Figure 2:
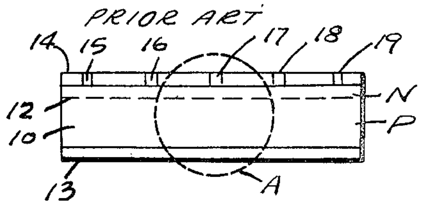
FIGURE 2 is a front view of the cell of FIGURE 1.
Figure 3:
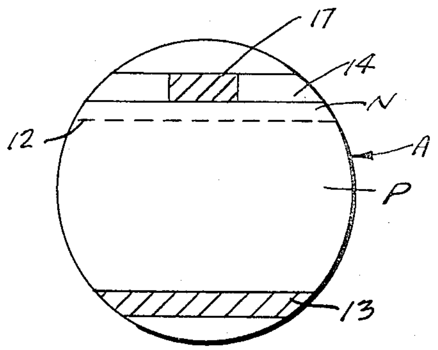
FIGURE 3 is an enlarged view of the circled portion of FIGURE 2 labeled A.

Referring first to FIGURES 1, 2 and 3, I have illustrated therein a typical prior art type of solar cell, which is of the type shown, for example, in the U.S. patent to Moshe Y. Ben-Sira et al., No. 3,053,926, which is assigned to the assignee of the present invention. Such cells are presently commercially available in a 1 by 2 cm. size, and are comprised of a body 10 of monocrystalline silicon which is of the P-type and which has a thin N-type surface layer over the upper surface defining the P-N junction 12. A conductive electrode 13 extends over the whole bottom surface of the wafer, while the upper electrode is formed of a collector strip 14 which has elongated grids such as grids 15 through 19 extending along the upper surface of the device.

As pointed out above, the design of such a cell involves several compromises to obtain various desired parameters in the cell operation. The first of these is the radiation resistance of the cell.

In the operation of the cell, when light of sufficient energy penetrates the upper surface of the cell, whole-electron pairs are generated. If these pairs are generated within a minority carrier diffusion length *l* of the junction 12, the probability that the minority carrier will be collected by the junction 12 is high. Under a given set of conditions, the greater the percentage of minority carriers collected by the junction 12, the greater will be the short circuit current produced by the cell. If now the cell is exposed to radiation of such energy which permanently affects the structure of the silicon lattice, the diffusion length of minority carriers will be reduced, which, in turn, reduces the output of the cell.

By producing cells with an N-type region on the surface that is thinner than the minority carrier diffusion length, the collection efficiency of minority carriers produced in this region will not be affected by radiation damage until the diffusion length is reduced to a length smaller than this dimension.

Since the shorter wavelengths of light in the blue and ultraviolet regions do not penetrate very far into the silicon, this thin N-type layer above junction 12 will provide a cell having good blue and ultraviolet response which will be much less affected by radiation damage than will its response to the longer wavelength portion of the spectrum. However, the cell efficiency will be substantially reduced by radiation damage due to decrease in the response to this longer wavelength portion of the spectrum.

Thus, for purposes of at least some radiation resistance, it is desirable to have the upper N-type layer as thin as possible. This requirement, however, is contradictory to the requirement for reduced internal cell resistance.

Turning now to the internal cell resistance of the cell of FIGURES 1, 2 and 3, when a solar cell is operating at its maximum power point, it will draw approximately 80% of its short circuit current. Therefore, the internal cell resistance should be reduced to a minimum. The primary source of this cell resistance is the sheet resistance of the top N-type layer. The thinner this layer is made in order to improve spectral response, the more serious the problem of internal cell resistance becomes.

In order to retain a relatively thin N-type layer, it has become necessary to use the metallized collector grids 15 through 19 over the surface of the cell. This, however, reduces the active area of the cell. Therefore, cell resistance is seen to place a limit on the degree to which the thickness of the top N-type layer can be reduced.

Turning next to the parameter of open circuit voltage, in most solar cells, the upper N-type layer is very heavily doped so that the open circuit voltage of the cell is primarily a function of the resistivity of the starting material. Within the certain limits, the lower resistivity of the starting material, the higher the open circuit voltage of the cell. It has been found empirically, however, that cells made from higher resistivity material do not degrade as rapidly due to radiation damage than cells of the lower resistivity material. Therefore, in the prior art devices, some open circuit voltage is sacrificed by using the higher resistivity material to achieve greater radiation resistance.

Turning next to the short circuit current parameter, and as was mentioned earlier, there is a high probability that minority carriers generated within a diffusion length $l$ of the junction will be collected by the junction and thus will contribute to the short circuit current of the cell. Those minority carriers which are not collected by the junction will recombine either with majority carriers in the bulk of the material or at the surface of the wafer. The surface recombination rate, moreover, is normally much higher than the bulk recombination rate.

For this reason, it has been desired to produce cells with the thin N-type surface since a larger percentage of carriers produced will be produced on the side of the junction which is not accessible to the surface. Note, however, that this is again contradictory to the decrease of internal cell resistance so that again some design compromise must be made.

In accordance with the present invention, a novel cell construction is provided which is shown in FIGURES 4 through 7 wherein elongated relatively flat P-type regions or strips are embedded directly beneath the surface of an N-type material.

Referring now to FIGURES 4 through 7, the device may be considered to be an N-P-N structure wherein the silicon wafer 30 is provided with a conductive material 31 over its full bottom surface to serve as the rear electrode and a simple collector strip 32 along one edge of the opposite surface to serve as the front electrode. The body of the wafer is then of the N-type, and contains the elongated P-type strips such as the P-type strip 35 which has a generally flat upper surface 36 which is adjacent the upper surface of the wafer. In particular, the upper surface 36 may be spaced by 0.0001 cm. from the upper surface of wafer 30, thereby defining in effect an upper N-type layer having a thickness of 0.0001 cm. This is to be contrasted to surface layer thicknesses of 0.0003 cm. used in prior art devices wherein this thickness could not be reduced, since the internal cell resistance would be greatly increased.

The P-type strips 35 are then separated from one another by bridges of N-type material such as the bridges 37 which extend from the upper N-type layer to the body of N-type material and separate the P-type regions 35. Clearly any desired number of strips could be formed.

As best shown in FIGURE 7, each of the strips are then connected at the upper and rear surface of the cell so that the collector strip 32 sits upon a P-type strip region.

The bridges 37 will define a relatively small percentage of the cell area, and serve to connect the top N-type region with the N-type substrate. These small bridges also function in the manner of the collector strips 15 through 19 of FIGURE 1 for the top N-type surface. However, unlike the collector strips of the prior art, these areas are still active areas since carriers generated in these regions can be collected by the self-enclosed junctions on either side of the bridges.

Each of the P-type strips is further provided with a relatively deep extending section shown in FIGURE 5 as extending section 40. These extending sections will also represent a relatively small percentage of the total cell area and function as low resistance collector grids for the P-type regions. However, unlike the collector strips of the prior art cells, these regions would function as a normal N on P-type cell.

In a typical device, the P-type region 35 can have a total width of 0.1 cm., a thickness of 0.001 cm., while the extending section 40 can have a depth of 0.005 cm. and a width of 0.005 cm. The bridging regions 37 may then have a width of the order of 0.005 cm.

A cell constructed in the manner shown in FIGURES 4 through 7 will have a substantially improved radiation resistance since the major portions of the top N and P-type regions of the cell can be made relatively thin, as will be discussed more fully when considering cell resistance, so that both the N and P-type regions can be much smaller than the minority carrier diffusion length. Therefore, there will be no degradation of collection efficiency due to radiation damage for carriers generated in either of these regions and in a region of equivalent thickness below the P regions until this damage is severe enough to reduce the diffusion length to a value comparable with these dimensions.

Since most of the excess carriers are generated near the top surface of the cell, this will result in substantial improvement in radiation resistance. Note that the only cell areas which will suffer the normal degradation due to radiation damage are the bridging areas 37.

In regard to internal cell resistance, it can be shown that the internal cell resistance of a prior art solar cell having an area of 1 by 2 centimeters and, in the absence of collector grids 15 through 19, will have a cell resistance of approximately 3.7 ohms. In order to reduce this cell resistance by the provision of the collector grids, this resistance can be reduced to approximately 1.4 ohms.

It can be shown that by using the novel configuration of the invention, the cell resistance will be reduced to approximately 2.9 ohms which is approximately two-thirds that of the standard unit which does not use collector grids.

In the cell having an internal resistance of 2.9 ohms, the cell had a length of 1 cm., a width of 2 cms., and used 20 P-type strips each having a length of 0.2 cm. The bridges 37 had a width of 0.005 cm. The region 40 of FIGURE 5 had a width of 0.005 cm., and extended a total depth of 0.005 cm. from the upper surface of the wafer. The upper N-type region, or the distance from surface 36 to the top of the wafer, was 0.0001 cm., and the distance from the top of the surface to the bottom of the elongated P-type strip was 0.001 cm.

While the internal resistance of 2.9 ohms is somewhat higher than that of the complex gridded cell, it will be noted that this internal resistance can be reduced by using a very thin silicon wafer body (0.01 cm. in thickness), and diffusing broader P-type grids into the reverse side of the cell, as will be described more fully hereinafter with reference to FIGURE 16. Such an arrangement can reduce internal cell resistance to approximately 1.2 ohms, which is below even that of the gridded cell of FIGURES 1, 2 and 3.

Turning next to the parameter of open circuit voltage, due to the greater radiation resistance obtainable from the cell construction of FIGURES 4 through 8, it is possible now to strike a new compromise between radiation resistance and open circuit voltage whereby the open circuit voltage can be increased by using a lower resistivity material. In particular, it is possible to use a material having a resistivity of 0.1 ohm cms., thereby increasing open circuit voltage from 0.5 volt to 0.6 volt.

In regard to short circuit current, the novel cell of FIGURES 4 through 7 produces a higher short circuit current than an equivalent prior art device, since there is a larger total volume of material which is within a minority carrier diffusion length of a collector junction. Moreover, and since it is now possible to reduce the thickness of the top N-type region, surface recombination can be reduced which will cause a further increase in short circuit current and will also improve the blue and ultraviolet response of the cell.

FIGURES 8 through 15 illustrate one procedure for manufacture of the device of FIGURES 4 through 7, although it will be apparent to those skilled in the art that many other procedures could be used.

Figure 8:
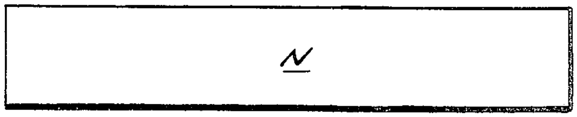

Referring first to FIGURE 8, I have illustrated therein in side view a typical wafer which can have any desired dimension, and a thickness of the order of .05 cm., and a resistivity of 1 ohm cms.

Figure 9:
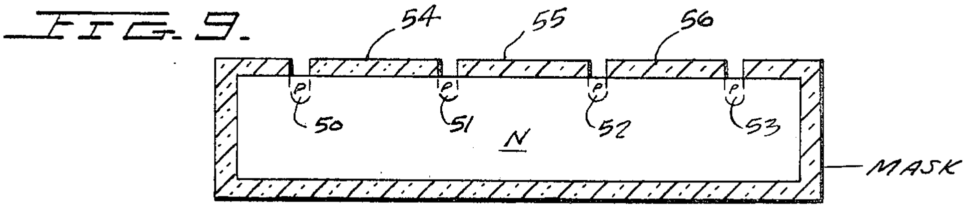
Figure 10:
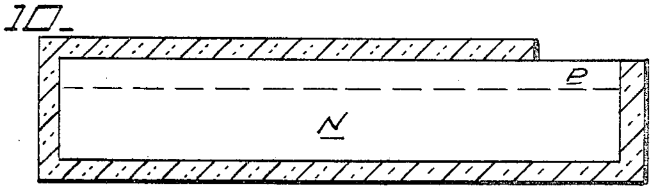
Figure 11:
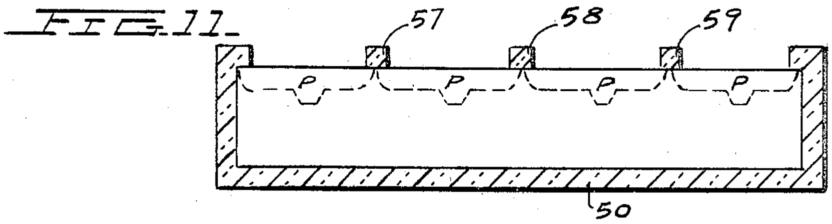

The surfaces of the N-type wafer of FIGURE 8 are masked, as shown in the side view of FIGURE 9 and the end view of FIGURE 10, and the assemblage is then placed in a suitable diffusion furnace and P-type impurities are diffused into the upper surface in strips such as strips 50, 51, 52 and 53 along the full length of the upper surface with one end of the strips being connected to each other by a collector strip which runs the full width of the upper surface along one edge as shown in FIGURE 10 and to a depth of about 0.05 cm. The actual number of mask strips to be used correspond to the actual number of P-type strips 35 which are to be formed in the device. Thus, 20 such masking strips 54, 55 and 56 can be applied to the wafer surface. Note that any suitable masking techniques could be used such as masks formed by thermally grown silicon oxides removed by photoresist techniques or by any other desired process, in the regions where no masking is desired.

Thereafter the cell is removed from the furnace and, after cooling, a plurality of masks such as masks 57, 58 and 59 are applied in strips over the full length of the upper surface and midway in between P-type regions 50, 51 and 52.

Thereafter, the wafer is returned to a diffusion furnace and a P-type impurity diffused into the exposed surfaces between the mask strips with the P-type diffusion proceeding to a depth of about .001 cm.

Figure 12:
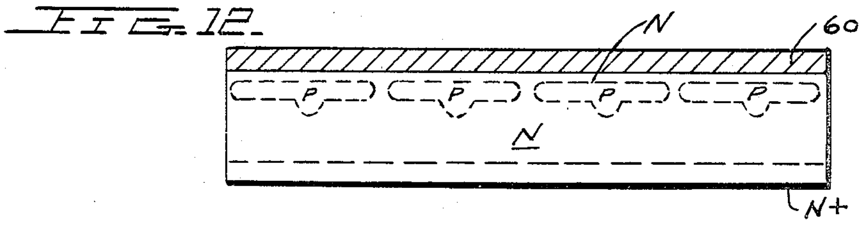
Figure 13:
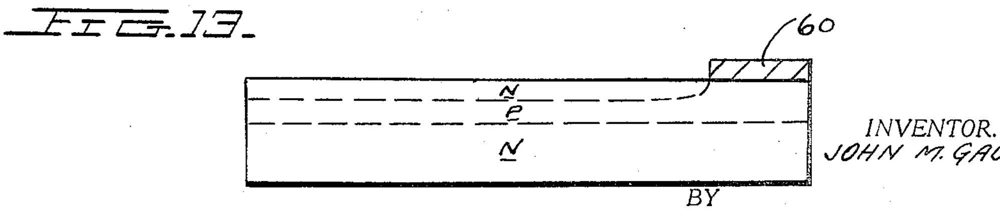

Thereafter, the wafer is removed from the furnace and, after cooling, a single mask strip 60 is applied along the entire width of the slice over the collector strip region as shown in the side view of FIGURE 12 and the end view of FIGURE 13. The wafer is then placed in a diffusion furnace and an N-type impurity is diffused into the unmasked surfaces to a depth of about .0001 cm.

Figure 14:
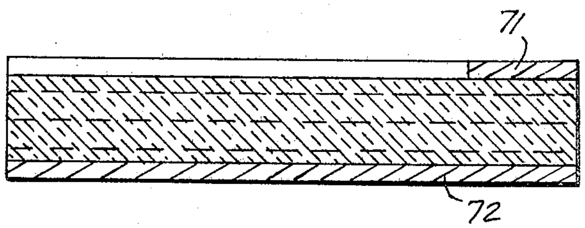

Thereafter, and as shown in FIGURE 14, collector strip 71 and a rear electrode 72, corresponding to collector strip 32 and rear electrode 31, respectively, of FIGURES 4 through 7, are applied to the P surface region and N+ surface regions, respectively, which are exposed to these electrodes.

As previously noted, the internal resistance of the cell can be substantially reduced through the provision of an additional P-type region which is adjacent the rear of the cell. This arrangement is shown in FIGURE 15 which is substantially identical to FIGURE 6, and wherein numerals identifying similar structures in FIGURE 6 are used in FIGURE 15.

In FIGURE 15, however, instead of terminating the extending portion 40 of the P-type strip 35, this extending section forms a bridge 80 which connects with a second elongated P-type region 81. Thus, the enclosed P-type regions embedded within the N-type wafer material will have the form of an I, and are separated from one another by N-type bridges, as shown in FIGURE 15. Note that in the device of FIGURE 16, the total wafer thickness is preferably no greater than 0.010 cm.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A solar cell comprising a thin wafer of monocrystalline semiconductor material having impurity atom concentrations therein for forming P-type and N-type conductivity characteristics, a plurality of substantially flat parallel strip regions of one conductivity type disposed beneath the upper surface of said wafer; the remainder of said wafer consisting of the other conductivity type surrounding said flat, parallel, strip regions, thereby defining embedded and enclosed P-N junctions; each of said strip regions lying in a common plane and being spaced from one another by narrow bridges of said other conductivity type.

2. The device substantially as set forth in claim 1 wherein said one conductivity type is of the P-type.

3. The device substantially as set forth in claim 1 wherein each of said flat strip regions extends to the upper surface of said wafer at one end thereof; and a first and second electrode; said first electrode comprising a collector strip of conductive material connected to the portion of said end of said flat strip regions which extend to the upper surface of said wafer; said second electrode connected to the bottom surface of said wafer.

4. The device substantially as set forth in claim 1 wherein the top of each of said flat strip regions spaced from the upper surface of said wafer by approximately 0.0001 cm.

5. The device substantially as set forth in claim 4 wherein said plurality of strip regions are spaced from one another by approximately 0.005 cm.

6. The device substantially as set forth in claim 4 wherein each of said strips regions has a thickness of approximately 0.001 cm. and a width of approximately 0.1 cm.

7. The device substantially as set forth in claim 1 wherein the bottom of each of said strip regions have projecting sections extending from central regions thereof.

8. The device substantially as set forth in claim 7 wherein said projecting sections have a width of approximately 0.005 cm. and a depth of approximately 0.005 cm.

9. The device substantially as set forth in claim 1 which includes a second plurality of substantially flat spaced parallel strip regions of said one conductivity type disposed beneath the bottom surface of said wafer and defining embedded and enclosed junctions; each of said second plurality of strip regions being spaced from a respective strip region of said plurality of strip regions and connected thereto by a thin central bridge of material of said one conductivity type.

References Cited

UNITED STATES PATENTS 2,911,539 11/1959 Tanenbaum ---------- 136—89

WINSTON A. DOUGLAS, Primary Examiner

M. J. ANDREWS, Assistant Examiner